United States Patent
Hshieh et al.

[11] Patent Number: 5,929,481
[45] Date of Patent: Jul. 27, 1999

[54] HIGH DENSITY TRENCH DMOS TRANSISTOR WITH TRENCH BOTTOM IMPLANT

[75] Inventors: Fwu-Iuan Hshieh, Saratoga; Brian H. Floyd, Sunnyvale; Mike F. Chang, Cupertino; Danny Nim, San Jose; Daniel Ng, Sunnyvale, all of Calif.

[73] Assignee: Siliconix incorporated, Santa Clara, Calif.

[21] Appl. No.: 08/964,419

[22] Filed: Nov. 4, 1997

Related U.S. Application Data

[63] Continuation of application No. 08/684,363, Jul. 19, 1996, abandoned.

[51] Int. Cl.$^6$ .......................... H01L 29/76; H01L 29/94; H01L 31/062; H01L 31/113
[52] U.S. Cl. ............................................ 257/328; 257/330
[58] Field of Search .................................. 257/328, 329, 257/330

[56] References Cited

U.S. PATENT DOCUMENTS

| | | | |
|---|---|---|---|
| 4,376,286 | 3/1983 | Lidow et al. | 357/23 |
| 4,642,666 | 2/1987 | Lidow et al. | 357/23.4 |
| 4,893,160 | 1/1990 | Blanchard | 357/23.4 |
| 4,964,080 | 10/1990 | Tzeng | 257/330 |
| 5,298,442 | 3/1994 | Buluccea et al. | |
| 5,442,214 | 8/1995 | Yang | 257/328 |
| 5,558,313 | 9/1996 | Hshieh et al. | 257/328 |
| 5,714,781 | 2/1998 | Yamamoto et al. | |
| 5,821,583 | 10/1998 | Hsieh et al. | |
| 5,866,931 | 2/1999 | Buluccea et al. | |
| B1 4,376,286 | 7/1993 | Lidow et al. | 257/342 |

FOREIGN PATENT DOCUMENTS

| | | | |
|---|---|---|---|
| 56-58267 | 5/1981 | Japan . | |
| 405343691 | 12/1993 | Japan | 257/330 |

*Primary Examiner*—Stephen D. Meier
*Attorney, Agent, or Firm*—Skjerven, Morrill, MacPherson, Franklin & Friel LLP; Norman R. Klivans

[57] ABSTRACT

A trenched DMOS transistor overcomes the problem of a parasitic JFET at the trench bottom (caused by deep body regions extending deeper than the trench) by providing a doped trench bottom implant region at the bottom of the trench and extending into the surrounding drift region. This trench bottom implant region has the same doping type, but is more highly doped, than the surrounding drift region. The trench bottom implant region significantly reduces the parasitic JFET resistance by optimizing the trench bottom implant dose, without creating reliability problems.

6 Claims, 3 Drawing Sheets

HIGH DENSITY TRENCH DMOS TRANSISTOR WITH TRENCH BOTTOM IMPLANT

This application is a continuation of application Ser. No. 08/684,363, filed Jul. 19, 1996, now abandoned.

BACKGROUND OF THE INVENTION

1. Field of the Invention

This invention relates to transistors and more specifically to a high density trenched DMOS transistor.

2. Description of the Prior Art

DMOS (diffused metal oxide semiconductor) transistors are well known. Typically these transistors are used in integrated circuits or for power transistors. Some DMOS transistors are trenched transistors; a conductive gate electrode, typically polycrystalline silicon (polysilicon), is located in a trench in the transistor substrate, and the sidewalls and bottom of the trench are insulated with silicon dioxide. The trenched structure increases transistor density by reducing the chip surface area consumed by the polysilicon gate of each transistor. Typically such transistors are used in low to medium voltage applications, and each transistor includes a large number (thousands) of cells. Each cell is defined by a source region diffused into the substrate and by the gate electrode trenches.

The provision of the trenches advantageously increases cell density and also reduces the undesirable parasitic JFET (junction field effect transistor) resistance which typically is present between adjacent cells. The parasitic JFET resistance is one component of the total on-state resistance, $R_{DSON}$, which is characteristic of such transistors in their conductive (on) state; it is desirable to minimize the on-resistance.

However, trenches do not completely eliminate parasitic JFET resistance. When cell density is high in a trenched DMOS transistor, a new parasitic JFET phenomenon gradually appears between the adjacent deep body P+ regions which extend alongside the trench and are typically used to protect the trench regions and ensure reliability. Unfortunately, this new JFET resistance becomes a significant component of on-resistance as cell density increases.

By design, avalanche breakdown occurs in the P+ doped regions away from the trench bottom. In a typical DMOS transistor having a trenched gate electrode, in order to avoid destructive breakdown occurring at the bottom of the trench into the underlying drain region, the deep body P+ region extends deeper than does the bottom of the trench. Rather than the destructive breakdown occurring at the trench bottom, therefore instead the avalanche breakdown occurs from the lowest portion of this deep body P+ region into the underlying relatively nearby drain region.

It is well known that the trenched DMOS transistor structure is superior to a planar DMOS transistor in terms of drain-source specific on-resistance, which is resistance times the cross-sectional area of the substrate carrying the current. The JFET resistance, inherent in planar DMOS transistors, is significantly reduced and cell density is enhanced by reducing the length of the gate electrode.

An example of a planar DMOS transistor is disclosed in Lidow et al. U.S. Pat. No. 4,642,666 issued Feb. 10, 1987 which discloses as shown in present FIG. 1 (similar to FIG. 2 of Lidow et al.) a high power MOSFET in which two laterally spaced sources each supply current through respective channels in one surface of a semiconductor chip, controlled by the same gate. The epitaxially deposited semiconductor material immediately adjacent and beneath the gate and in the path from the sources to the drain is of relatively high conductivity (is highly doped), thereby substantially reducing the on-resistance of the device without affecting the device breakdown voltage.

Thus as shown in present FIG. 1, the Lidow et is al. MOSFET is formed in a chip of monocrystalline silicon 20. Two source electrodes 22 and 23 are separated by a metallized gate electrode 24 which is fixed to but spaced apart from the semiconductor device surface by a silicon dioxide layer 25. Each of source electrodes 22 and 23 supply current to a drain electrode 26 which is fixed to the bottom of the wafer. An N− doped epitaxial layer is deposited on N+doped substrate 20. P+ doped regions 30 and 31 each include a curved lower portion which serves as a deep body region. Two N+ regions 32 and 33 are formed at the source electrodes 22 and 23 respectively and define, with the P doped regions 34 and 35, channel regions 36 and 37 which are disposed beneath the gate oxide 25 and can be inverted from P-type to N-type by the appropriate application of a bias voltage to the gate 24 in order to permit conduction from the source electrodes 22 and 23 through the inversion layers into the central region disposed beneath the gate 24 and then to the drain electrode 26. (Reference numbers used herein referring to FIG. 1 differ somewhat from those in the Lidow et al. disclosure.)

In the central region beneath the gate 24 is located a highly conductive N+ doped region 40 disposed immediately beneath the gate oxide 25. The N+ region has a depth of about 4 µm. Region 40 is relatively highly doped compared to the N− doped region immediately beneath it. By making region 40 of relatively highly conductive N+ material by a diffusion or other operation, the device characteristics are significantly improved and the forward on-resistance of the device is reduced by a factor greater than two. Provision of the high conductivity region 40 does not interfere with the reverse voltage characteristics of the device. Accordingly the forward on-resistance of the ultimate high power switching device is significantly reduced.

However the Lidow et al. device is a planar (non-trenched) transistor structure and has the accompanying drawbacks of relatively low cell density and relatively high inherent JFET resistance.

SUMMARY

In accordance with the present invention, a trenched DMOS transistor includes a trench bottom implant region which is of the same doping type, but more heavily doped, than is the surrounding drift region. Thereby, the doping concentration in the area at the trench bottom is increased. This results in significant reduction of the JFET resistance otherwise characteristic of trenched DMOS transistors, by optimizing the concentration of the trench bottom implant region, without creating any reliability problems. Thus, in effect the new parasitic JFET observed by the present inventors at the trench bottom (where the deep body regions extend deeper than the trench) is substantially eliminated. Also, in accordance with the invention, trench corner electrical breakdown at high voltage is avoided, and avalanche still occurs in the P+ regions. The trench bottom implant region is fabricated in one embodiment by etching the trench in the substrate, lining the trench with oxide, and then performing a blanket implant of a dopant at a vertical angle, to form a doped region extending from the bottom of the trench into the surrounding drift region. This is accomplished prior to formation of the gate electrode itself in the trench, and also prior to forming the source, body and deep body regions.

U.S. Pat. No. 4,983,160 issued Jan. 9, 1990, to Blanchard depicts (see FIG. 3) a trenched DMOS transistor with an N+ doped region at the lower sides and bottom of the trench. The purpose of this N+ region is to increase breakdown voltage. Hence the doping level of this N+ region is fairly high. Moreover, in this transistor the P+ body regions are much shallower than is the trench, hence there being no parasitic JFET problem.

DETAILED DESCRIPTION OF THE PREFERRED EMBODIMENTS

Figure 1:
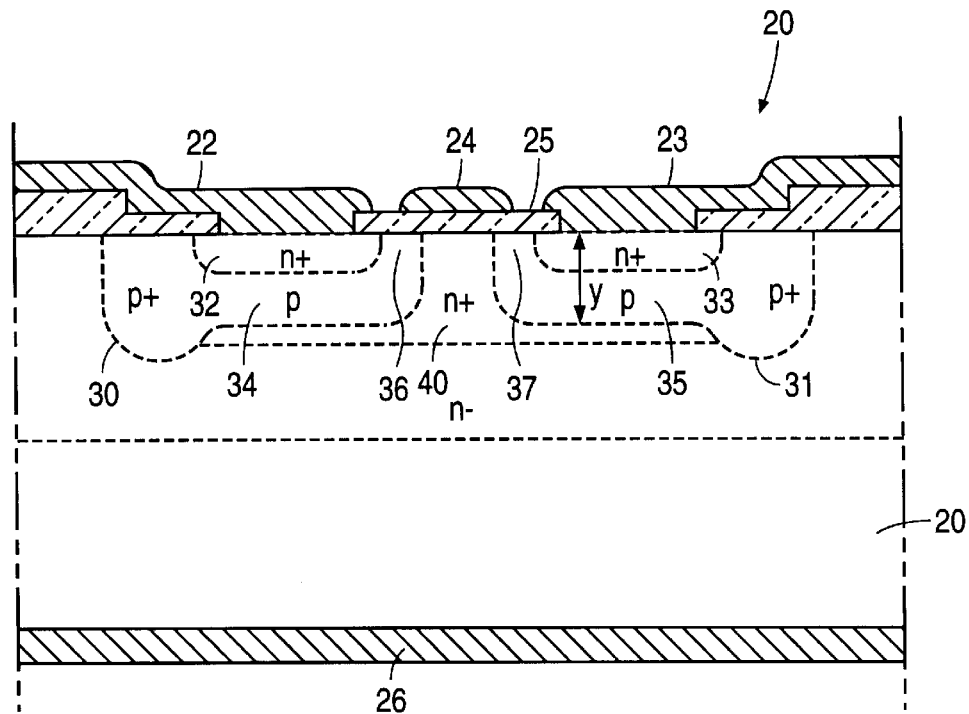
FIG. 1 shows a prior art planar MOSFET.
Figure 2:
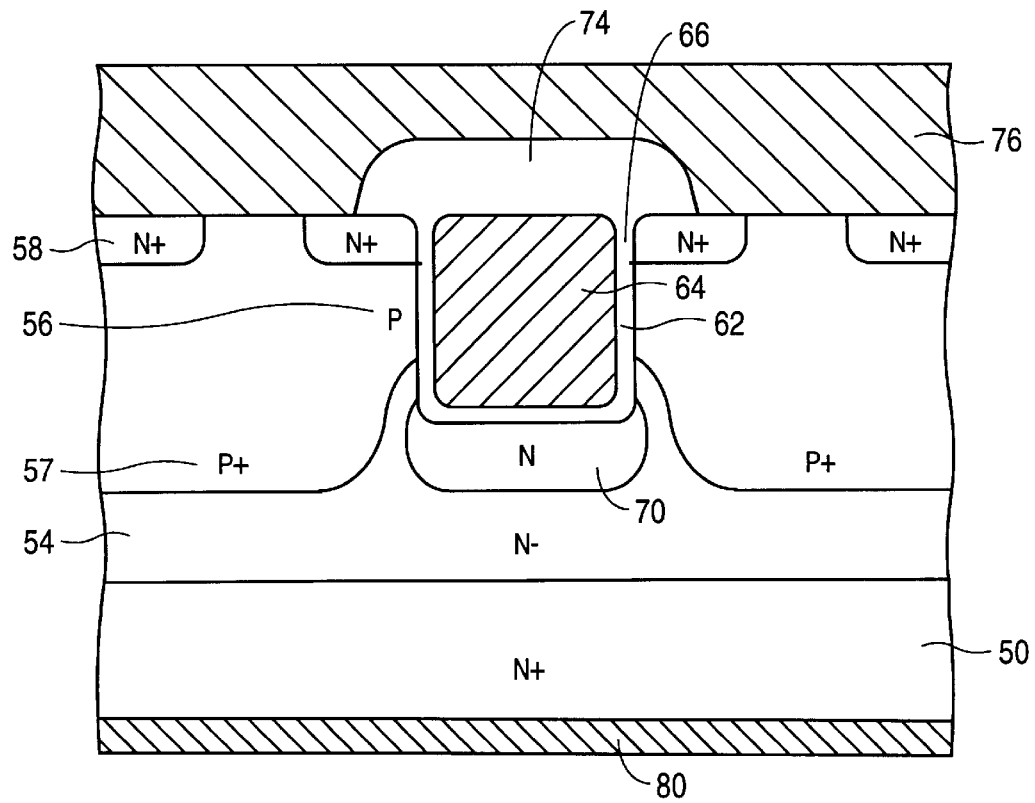
FIG. 2 shows a transistor in accordance with the present invention.

FIG. 2 shows a cross-section of a transistor in accordance with the present invention. This cross-section is drawn conventionally and shows only portions of several cells of a typical transistor, which may include thousands of such cells. However, a single cell transistor is also possible. Also, while the present disclosure is directed to a transistor having an N type (N doped) substrate, a P type (P doped) body region and an N type source region, it is to be understood that complementary devices are also possible wherein each conductivity type is reversed.

Also, the cross-sections shown here are not drawn to scale but are intended to be illustrative. While the various transistor doped regions shown here are conventionally delineated by lines, this is also illustrative rather than representative. In the figures, identical reference numbers used in various figures denote similar structures. Also, the various parameters disclosed herein for thickness, depths, widths, doping concentrations, dosages, and implantation energies are illustrative rather than limiting. Also, various materials may be used for the positive and negative type dopants. While the substances conventionally used for these dopant types may be used, this is not limiting.

The top side geometries for the various transistors herein are not depicted since these are conventional in terms of the cell arrangement and terminations. The terminations are generally not shown here but are e.g. those conventionally used with DMOSFETS.

FIG. 2 therefore shows in cross-section one cell (and a portion of adjoining cells) of the present transistor which includes drain region 50 N+ doped to a resistivity of e.g. 1 to 5 milliohm·cm and having a conventional thickness. Conventionally a metallized drain electrode 80 is formed on the bottom surface of this drain region 50 as an electrical contact thereto. Formed on the drain region 50 (substrate) is an N− doped (e.g. epitaxial) layer (this need not be an epitaxial layer but is conventionally so formed) which typically has a resistivity of 0.3 to 1.0 ohm·cm. The N− doped portion 54 of the epitaxial layer is conventionally referred to as a drift region. The epitaxial layer has a total thickness (extending to the principal surface of the transistor structure) of e.g. 8 to 12 $\mu$m.

A P doped body region 56 is formed in the upper portion of the epitaxial layer. A typical dopant level of the body region 56 at the principal surface is $5\times10^{15}/cm^3$. Included as part of body region 56 is a lower deep body P+ doped portion 57 having a total depth from the principal surface of the semiconductor body of about 2.5 $\mu$m and extending below the bottom of the trenches as shown. A typical doping level of the deep body P+ portion 57 is $2\times10^{19}/cm^3$.

Penetrating from the principal surface of the semiconductor body into the drift region 54 is a set of trenches which defines the transistor cells. (Only one such trench 62 is shown here, in cross-section.) Trench 62, as are the other trenches, is lined with gate oxide layer 66 which is typically 0.05 to 0.07 $\mu$m thick, and each trench 62 is then filled with a conductive doped polysilicon gate electrode 64. A typical width of trench 62 is 0.8 to 1.0$\mu$. A typical cell pitch is 6.0$\mu$. A typical depth of trench 62 is 1 to 2 $\mu$m (less than that of deep body portion 57). Typically therefore the P+ deep body portion 57 extends 0.5 $\mu$m below the bottom (floor) of the trench 62.

Formed in the upper portion of the epitaxial layer are N+ doped source regions 58, having a typical depth of 0.5$\mu$. A typical doping level of the N+ source regions 58 is $6\times10^{19}/cm^3$ at the principal surface. Penetrating through the middle of each source region 58 is the trench 62 in which is formed the conductive electrode gate 64. Insulating the upper portion of each conductive gate electrode 64 is a BPSG (borophosphosilicate glass) insulating layer 74 formed over gate electrode 64. Contacting the source regions 58 and body regions 56 is a source-body metallization layer 76.

The depiction herein is of the active portion only of the transistor. Each transistor active portion is typically surrounded by a termination, typically including doped regions and sometimes an additional filled-in trench. Conventional terminations are suitable in accordance with the present invention and hence the termination is not illustrated or described further herein.

A feature of the structure of FIG. 2 in accordance with the present invention is the trench bottom implant region 70, which is N doped to a concentration in a range of e.g. $1\times10^{16}$ to $8\times10^{16}/cm^3$. Intentionally, the trench bottom implant region 70 is of higher doping concentration than is the surrounding drift region 54 but of much lower doping concentration than drain region 50. Trench bottom implant region 70 advantageously eliminates the abovedescribed parasitic JFET, which in prior art MOSFETS appears between deep body P+ regions at the trench bottoms. Region 70 as shown extends as deep into drift region 54 as does the lowest part of deep body region 57, in this embodiment. The parasitic JFET resistance is thereby significantly reduced. Breakdown at the corners of the trench due to the local electric field concentration is also prevented by optimizing the implant dose.

Also, unlike the prior art planar transistor of Lidow et al., there is no punchthrough problem since there is no additional doping added in the channel region between the source and body regions. In the planar transistor structure of Lidow et al., there is an enhanced chance of lateral punchthrough from source regions 32 and 33 through the respective body regions 34 and 35. Such punchthrough would occur at the principal surface of the P body regions 34 and 35. Thus in the structure of FIG. 2, the blocking characteristics are not degraded while advantageously the on-resistance is reduced.

The typical thickness (height) of the trench bottom implant region 70 is 0.5$\mu$. The width is typically that of the trench, i.e. it extends from one side of the trench to the other including the trench corners, and extends a slight distance laterally from the trench corners, as a result of its fabrication by diffusion. A typical distance from the bottom portion of trench bottom implant region 70 to the substrate 50 is 1.0 $\mu$m, but this distance is not limiting; trench bottom implant region 70 can extend to substrate 50.

An exemplary process flow for fabricating the transistor of FIG. 2 is described hereinafter. It is to be understood that this process flow is not the only way to fabricate the structure of FIG. 2, but is illustrative. The various parameters given herein may be varied and still be in accordance with the present invention.

Figure 3A:
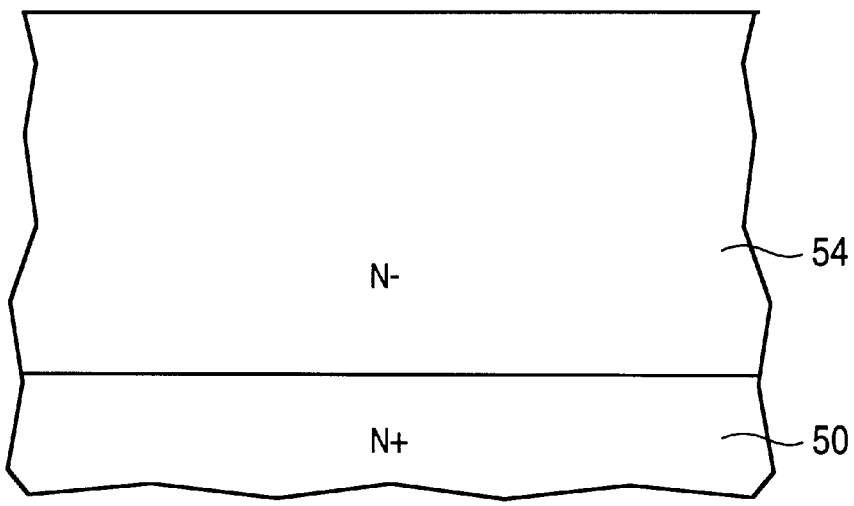
FIGS. 3A to 3D shows steps for forming a transistor in accordance with the present invention.

One begins as shown in FIG. 3A with an N+ substrate 50 conventionally doped to have a resistivity in the range described above. An epitaxial layer 54 is then grown thereon having a higher resistivity (as described above) and a thickness of e.g. 6 to 12 μm.

The principal surface of the semiconductor body including the epitaxial layer 54 then has a conventional active mask layer (not shown) formed thereon and patterned. This active mask layer may be oxide or other suitable material, and defines the active portion of the transistor and masks off the termination thereof. It is to be understood that the present figures show only the active portion, with the termination not being shown as being outside the area of the drawings.

Next (see FIG. 3B) a P+ region mask layer (not shown) is formed and patterned, masking off all portions of the principal surface of the semiconductor body except for where the P+ deep body portions (tubs) are to be formed. After patterning this mask layer, a P+ solid source diffusion is performed using boron nitride. Hence the P+ dopant is boron; the diffusion 57 is to a depth of about 1.5 μm.

Figure 3B:
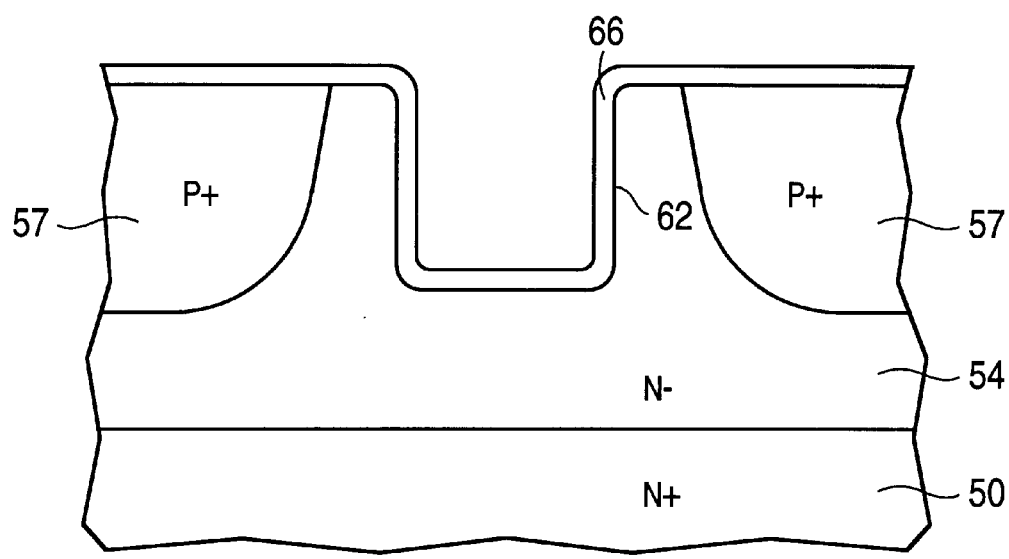

A trench mask layer (not shown) is then formed and conventionally patterned. Using the trench mask layer as a pattern, the trenches are then anisotropically etched. The trenches, e.g. trench 62, are then subject to a sacrificial oxide step to smooth their sidewalls and bottoms. This sacrificial oxide step involves growing a layer of oxide and then removing it by etching. The gate oxide layer 66 is then grown conventionally, as shown in FIG. 3B, to a thickness of e.g. 0.05 to 0.07 microns.

Figure 3C:
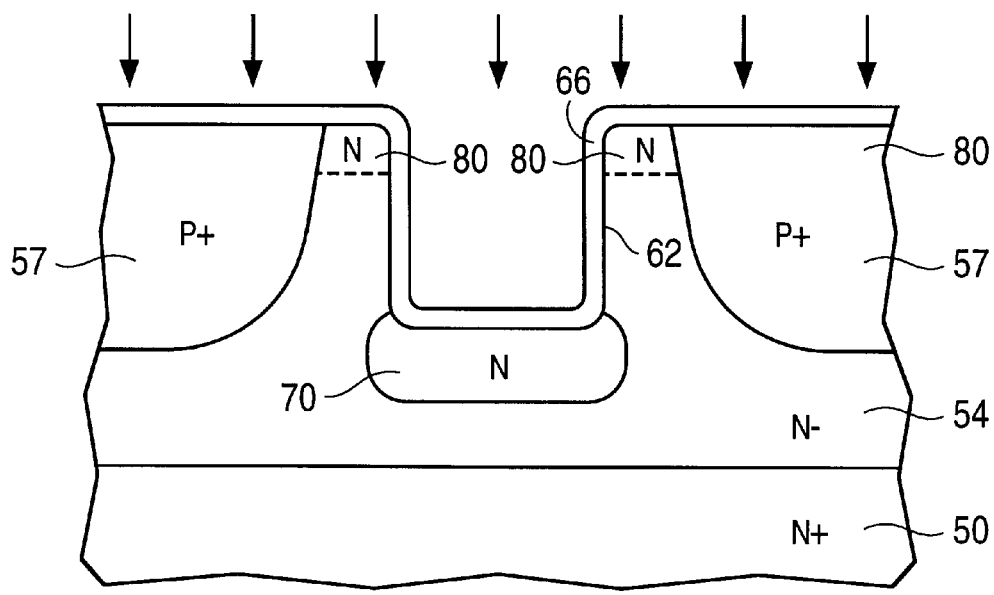

Then in a departure from the conventional process flow and as shown in FIG. 3C, a blanket N ion implant is carried out over the entire principal surface and into the trench 62. This is a vertical implant at an angle directly perpendicular to the plane defined by the principal surface of the semiconductor body. The implant energy is e.g. in the range of 30 to 100 KeV and a dose of $10^{12}$ to $10^{13}/cm^2$.

Figure 3D:
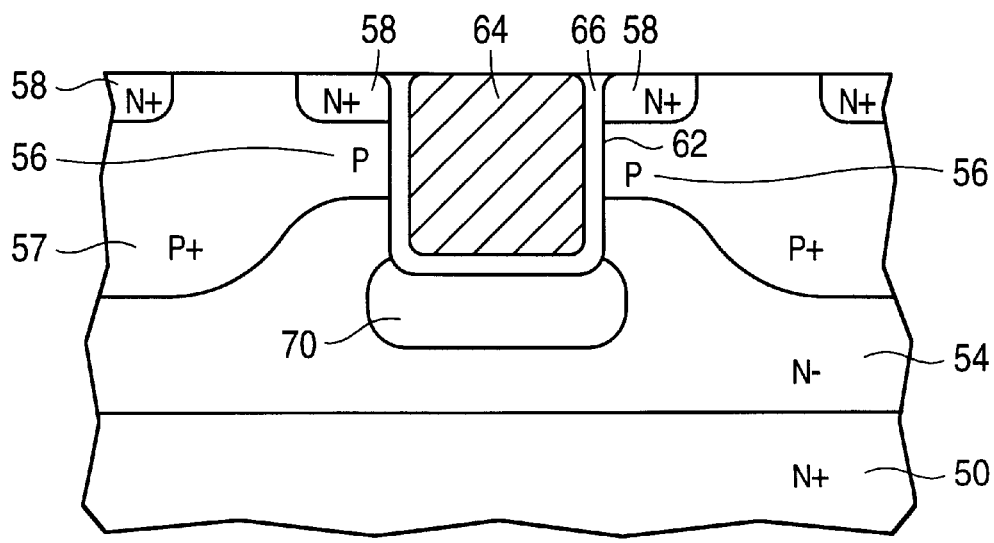

This trench bottom implant step results in the formation of an N doped region 70 the bottom of trench 62, and also the formation of corresponding N doped regions 80 extending from the principal surface. Then as shown in FIG. 3D, a layer of polysilicon 64 is formed on the principal surface of the semiconductor body and filling the trench 62. This polysilicon layer is doped with an N type dopant to achieve maximum conductivity.

Then conventionally a gate mask layer (polymask) is formed over the entire surface of the polysilicon layer and patterned. (This step is not depicted.) This gate mask layer is then used to etch away the polysilicon layer 64, except in the trench 62, and also leaving gate contact fingers (not shown) on the principal surface connecting the gate electrodes in the various trenches.

Then a blanket P-type implant forms the P doped body regions 56 to provide a channel alongside the trench sidewalls. This step uses a dosage of e.g. $10^{13}$ to $10^{14}$ per/cm$^2$ and an energy of 50 to 60 KeV, typically using boron as the dopant for an N channel device.

As depicted in FIG. 3D, the combined effects of the P body implant 56 and the P+ tub 57 effectively eliminate the N doped regions 80 of FIG. 3C.

Then an N+ source region mask layer is formed and patterned to define the N+ source regions 58. The N+ source region implant is then performed at an energy level of e.g. 60 to 100 KeV at a dosage of $5\times10^{15}$ to $8\times10^{15}/cm^2$, the dopant being arsenic. The N+ source mask is then stripped.

Next, a layer of borophosphosilicate glass (BPSG) is conventionally formed (not shown) to a thickness of 1 to 1.5 μm. A BPSG mask layer is then formed and patterned over the BPSG layer, and then the BPSG mask layer is used to etch the BPSG, defining BPSG region 74 of FIG. 2 insulating the top side of conductive gate electrode 64.

Then conventional steps are used to complete the device, i.e. stripping the BPSG mask layer, depositing the source-body metal layer, and masking the metal layer to define the source-body contact 76 of FIG. 2. Then a passivation layer is formed thereover and a pad mask is formed thereon and patterned to define the pad contacts through the passivation layer. The formation of the metal layer 76 has a corresponding step to form the contact 80 (see FIG. 2) to the drain layer 50 on the backside of the substrate.

This disclosure is illustrative and not limiting; further variations and modifications will be apparent to one skilled in the art in light of this disclosure and are intended to fall within the scope of the appended claims.

We claim:

1. A transistor structure comprising:

a substrate of a first conductivity type;

a drift region overlying the substrate and of the first conductivity type and doped to a concentration less than that of the substrate;

a body region of a second conductivity type opposite that of the first conductivity type overlying the drift region, and defining a principal surface of the transistor structure wherein the body region includes a channel portion in contact with a side of the trench near the principal surface, and a deep body portion more heavily doped than the channel portion and spaced apart from a side of the trench;

a conductive gate electrode extending in a trench from the principal surface through the body region and into the drift region to a depth less than that of the body region;

a source region of the first conductivity type extending into the body region from the principal surface; and a trench bottom region of the first conductivity type and of a higher doping concentration than the drift region, and extending from a bottom of the trench into the drift region as deeply as does the deep body portion of the body region and spaced apart from the body region.

2. The transistor structure of claim 1, wherein the trench bottom region has a doping concentration in a range of $1\times10^{16}/cm^3$ to $8\times10^{16}/cm^3$.

3. The transistor of claim 1, wherein the trench bottom region has a doping concentration at least four times that of the drift region.

4. The transistor structure of claim 1, wherein the trench bottom region is laterally spaced apart from the deep body portion of the body region.

5. The transistor structure of claim 1, wherein the trench bottom region extends at least 0.5 μm into the drift region from the bottom of the trench.

6. The transistor structure of claim 1, wherein the trench bottom region is spaced apart from the substrate by at least 1 μm.

* * * * *